United States Patent [19]

Holmberg et al.

[11] Patent Number: 4,651,185

[45] Date of Patent: Mar. 17, 1987

[54] METHOD OF MANUFACTURING THIN FILM TRANSISTORS AND TRANSISTORS MADE THEREBY

[75] Inventors: Scott H. Holmberg; Richard A. Flasck, both of San Ramon, Calif.

[73] Assignee: Alphasil, Inc., Fremont, Calif.

[21] Appl. No.: 723,509

[22] Filed: Apr. 15, 1985

Related U.S. Application Data

[62] Division of Ser. No. 532,654, Aug. 15, 1983, Pat. No. 4,545,112.

[51] Int. Cl.[4] ............................................. H01L 29/78
[52] U.S. Cl. ..................... 357/23.7; 357/4; 357/23.6; 357/30; 357/71; 357/23.9; 350/334
[58] Field of Search ............. 357/23.7, 4, 23.6, 23.9, 357/30, 71; 350/334

[56] References Cited

U.S. PATENT DOCUMENTS

| | | | |
|---|---|---|---|
| 3,675,090 | 7/1972 | Neale | 357/2 |
| 3,852,795 | 12/1974 | Ames | 357/4 X |
| 4,282,543 | 8/1981 | Ihara | 357/54 |
| 4,364,779 | 12/1982 | Kamgar | 357/23.15 |
| 4,404,578 | 9/1983 | Takafuji | 357/23.7 |
| 4,415,606 | 11/1983 | Cynkar | 427/90 |
| 4,425,572 | 1/1984 | Takafuji | 357/23.7 |
| 4,433,342 | 2/1984 | Potel | 357/71 X |
| 4,436,582 | 3/1984 | Saxena | 156/656 |
| 4,459,739 | 7/1984 | Shepherd | 357/4 X |

OTHER PUBLICATIONS

Fang, *IBM Tech. Discl. Bull.*, vol. 12, No. 12, May 1978.
Brodsky et al., *IBM Tech. Discl. Bull.*, vol. 20, No. 9, Feb. 1978.
Adamcik et al., *Telsa Electronics*, No. 10, No. 4, (Dec. 1971), p. 109.
Kramer, *Proceed. of the S.I.D.*, vol. 16/3, (3rd Quarter 1975), pp. 152–155.

*Primary Examiner*—Martin H. Edlow
*Attorney, Agent, or Firm*—Silverman, Cass, Singer & Winburn, Ltd.

[57] ABSTRACT

An improved method of manufacturing thin film transistors. A gate metal is patterned to form a gate electrode and a drain, gate and source contact pad for the transistor. To reduce shorts and capacitance between the gate and the source or the drain, a dielectric is patterned to form a central portion over a planar portion of the gate region and to cover any exposed gate edges.

14 Claims, 10 Drawing Figures

METHOD OF MANUFACTURING THIN FILM TRANSISTORS AND TRANSISTORS MADE THEREBY

This is a division of application Ser. No. 523,654 filed Aug. 15, 1983 now U.S. Pat. No. 4,545,112.

BACKGROUND OF THE INVENTION

The present invention pertains to an improved thin film transistor and method of making same. More particularly, the present invention is directed to a method of making thin film transistors to increase the yield of the finished transistors and devices made therefrom.

In recent years there has been growing interest in thin film transistors and devices incorporating such thin film transistors, such as memory arrays, all types of integrated circuits and replacements for mechanical switches and relays. For example, reed relays can fatigue and MOS switches exhibit too much leakage current.

A specific exemplary use of the thin film transistor is in flat panel displays, such as those which employ liquid crystals, electrochromic or electroluminescence, as replacements for conventional cathode ray tubes (CRT). The flat panel displays promise lighter weight, less bulk and substantially lower power consumption than CRT's. Also, as a consequence of their mode of operation, CRT's nearly always suffer from some distortion. The CRT functions by projecting an electron beam onto a phosphor-coated screen. The beam will cause the spot on which it is focused to glow with an intensity proportional to the intensity of the beam. The display is created by the constantly moving beam causing different spots on the screen to glow with different intensities. Because the electron beam travels a further distance from its stationary source to the edge of the screen than it does to the middle, the beam strikes various points on the screen at different angles with resulting variation in spot size and shape (i.e. distortion).

Flat panel displays are inherently free of such distortion, because each pixel element receives the same power. In the manufacture of flat panel displays the circuit elements are deposited and patterned, generally by photolithography, on a substrate, such as glass. The elements are deposited and etched in stages to build a device having a matrix of perpendicular rows and columns of circuit control lines with a pixel contact and control element between the control line rows and columns. The pixel contact has a medium thereon which is a substance that either glows (active) or changes its response to ambient light (passive) when a threshold voltage is applied across the medium control element. The medium can be a liquid crystal, electroluminescent or electrochromic materials such as zinc sulfide, a gas plasma of, for example, neon and argon, a dichroic dye, or such other appropriate material or device as will luminesce or otherwise change optical properties in response to the application of voltage thereto. Light is generated or other optical changes occur in the medium in response to the proper voltage applied thereto. Each optically active medium is generally referred to as a picture element or "pixel".

The circuitry for a flat panel display is generally designed such that the flat panel timeshares, or multiplexes, digital circuits to feed signals to one row and column control line of the pixels at a time. Generally one driving circuit is used for each row or column control line. In this way a subthreshold voltage can be fed to an entire row containing hundreds or thousands of pixels, keeping them all dark or inactive. Then a small additional voltage can be supplied selectively to particular columns to cause selected pixels to light up or change optical properties. The pixels can be made to glow brighter by applying a larger voltage or current or a longer pulse of voltage or current. Utilizing liquid crystal displays (LCD's) with twisted nematic active material, the display is substantially transparent when not activated and becomes light absorbing when activated. Thus, the image is created on the display by sequentially activating the pixels, row by row, across the display. The geometric distortion described above with respect to CRT's is not a factor in flat panel displays since each pixel sees essentially the same voltage or current.

One of the major problems that arises with respect to the prior art method of manufacturing backplanes for active matrix displays (e.g. those employing thin film transistors at each pixel) is that they generally suffer production yield problems similar to those of integrated circuits. That is, the yields of backplanes produced are generally not 100% and the yield (percentage of backplanes with no defects) can be 0% in a worst case. High quality displays will not tolerate any defective transistors or other components. Also, larger size displays are generally more desirable than smaller size displays. Thus, a manufacturer is faced with the dilemma of preferring to manufacture larger displays, but having to discard the entire product if even one transistor and hence one pixel is defective. In other words, the manufacturer suffers a radically increased manufacturing cost per unit resulting from decreasing usable product yield.

These problems of increased cost and decreased yield are dramatically improved in the present invention by providing a method of manufacturing transistors with a greatly reduced number of defects which can be utilized in all types of integrated circuits.

SUMMARY OF THE INVENTION

There is provided an improved method of manufacturing improved transistors to greatly reduce device defects. These improvements are accomplished by depositing a gate metal on the substrate which serves both as a gate for the transistors and as a gate, source and drain contact pad. To eliminate shorts between the gate and the source or the drain, a dielectric is deposited over the gate or the gate and gate insulator and semiconductor. The dielectric is then etched away only in the central planar portion of the gate region to eliminate any edge shorting. The gate edge shorting is eliminated since the following layers are deposited only on the planar portion with the edges isolated therefrom.

DESCRIPTION OF THE PREFERRED EMBODIMENTS

Figure 1:
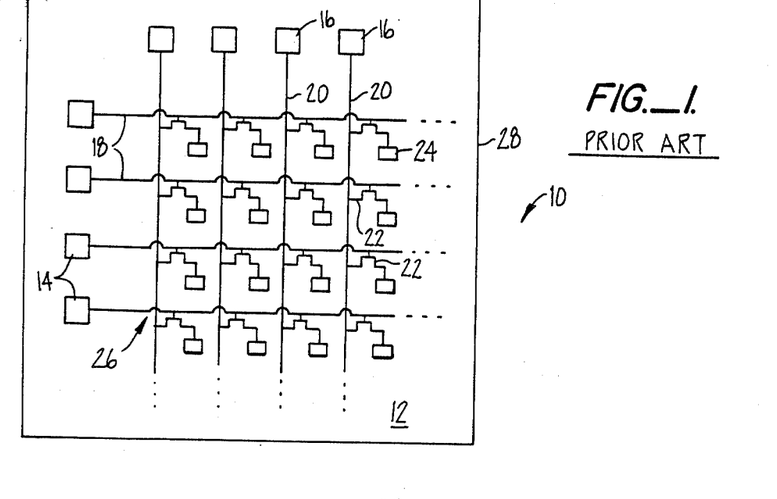
FIG. 1 is a plan view schematic representation of an active matrix display backplane made by a prior art method.

As mentioned above, numerous devices can be formed utilizing thin film transistors, one particular utilization is active matrix flat panel display devices. Referring now more particularly to FIG. 1, there is shown a schematic representation of an active matrix flat panel display device 10 made in accordance with conventional photolithographic techniques. One such device 10 and the manufacture thereof is more fully described in Application of Amorphous Silicon Field Effect Transistors in Addressable Liquid Crystal Display Panels, A. J. Snell et al., *Applied Physics*, No. 24, p. 357, 1981. The device 10 includes a substrate 12, sets of contact pads 14 and 16, sets of control lines 18 and 20, and, in this particular example of the prior art, transistors 22 and pixel back contacts 24.

The substrate 12 commonly employed in these devices is formed from glass. The control lines 18 and 20 are organized into a matrix of rows 18 and columns 20. The control line rows 18 in this device 10 serve as gate electrodes and the control line columns 20 as source connections. One contact pad 14 is connected to each end of the row control lines 18. One contact pad 16 is connected to each end of the column control lines 20. The display drive control (not shown) is connected to the sets of pads 14 and 16.

At each matrix crossover point 26, where a row line 18 and a column line 20 cross, one switching element, transis- tor 22 is formed to connect the row line 18 and column line 20 to the pixel back contacts 24. The active medium is deposited at least on the contacts 24 which will optically change properties in response to the combined voltages or currents in the respective crossover point 26 formed by the row 18 and column 20. The active medium at a given crossover point 26 will appear as a square or dot in the overall checkerboard type matrix of the display 10. The actual size of the transistors 22 and the contacts 24 are not drawn to scale, but are shown schematically for illustration only.

It should be noted that theoretically there is no limit on the number of rows 18 and columns 20 that can be employed, only a portion of which are illustrated in FIG. 1. Therefore, there is also no theoretical limit on the outside dimensions of such a device 10. However, the present state of the lithographic art places a practical limit on the outside dimensions of these devices. The present alignment techniques allow display devices to be manufactured approximately five inches on a side 28.

The problem encountered by the prior art method of manufacture is that if the device 10 contains any defective pixel transistors 22 or other circuit elements causing a pixel to be inoperative, it must be discarded.

A memory array would be substantially organized in the same grid as the rows and columns of the device 10. The pixels 24 would be replaced by the memory elements in the array. The rows 18 could contact the sources, the columns 20 could contact the drains and a third set of rows or columns could contact the gates.

Figure 2:
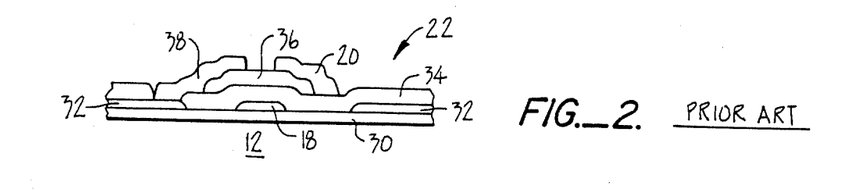
FIG. 2 is a cross-section of one transistor of the prior art backplane.

Referring in detail to FIG. 2, several problems occur when the switching element, transistor 22 is manufactured. The substrate 12 is a substantial portion of the backplane cost and hence an inexpensive soda-lime glass is generally utilized. It has been demonstrated by liquid crystal display manufacturers that the high sodium concentration can poison the liquid crystal material by diffusing through the overlying ITO layer and hence an $SiO_2$ suppression layer 30 is generally formed on the substrate 12. There are some high quality low sodium types of substrates available, which would not need the suppression layer 30. An ITO layer 32 is formed and etched to provide an ITO free area on which the gate 18 is deposited. Following the deposition of the gate 18, a gate insulator layer 34 is deposited. Although a smooth uniform coverage of the gate 18 by the insulator 34 is illustrated, in production the gate 18 has or can have sharp edges which lead to pin holes or thinning of the insulator 34 at the gate edges. The source and drain metals can short to the gate 18. The thinning or pin holes produce transistors 22, which if operative, do not have uniform operating characteristics and hence the backplane is worthless.

One attempt to solve this problem, is to make the gate 18 very thin, but the resistivity is then too high to make the large arrays necessary for the backplane or for memory arrays. A second attempt to solve the probem, is to make the gate insulator 34 very thick, but this decreases the gain of the transistor 22 and is also self defeating.

An amorphous silicon layer 36 is then deposited, with the source 20 and a drain 38 deposited thereover. A passivating layer (not shown) would be deposited over the completed structure to complete the transistor 22. During operation the activation of the source 20 and the gate 18 couples power through the silicon alloy 36 to the drain and hence to the contact pad 24 formed by the ITO layer 32.

In processing the backplane to form the transistor 22, the ITO layer 32 is subjected to numerous processing steps, both in depositing the materials and in etching the materials away. This can lead to nonuniformity of the ITO layer 32 which can also cause the backplane to be defective. These problems are overcome by the method and resulting backplane and transistor structure employed in copending application, Ser. No. 493,523, filed May 11, 1983, entitled "An Improved Method Of Manufacturing Flat Panel Backplanes, Display Transistors And Displays Made Thereby", assigned to the present assignee and incorporated herein by reference.

Figure 3:
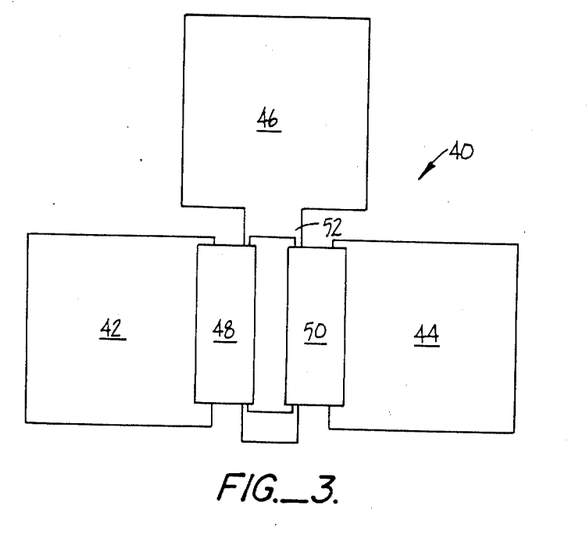
FIG. 3 is a plan view schematic representation of one embodiment of a transistor of the present invention.

A transistor 40 of the present invention is illustrated schematically in FIG. 3. Although only a single transistor 40 is illustrated, a plurality of transistors 40 can be formed and connected together as appropriate for a particular integrated circuit application, such as the flat panel display 10. The transistor 40 includes a drain contact pad 42, a source contact pad 44 and a gate contact pad 46. A drain 48 connects the transistor 40 to the contact pad 42, which could be formed integrally therewith. A source 50 connects the transistor 40 to the contact pad 44, which also could be formed integrally therewith. A gate 52 preferably is formed integrally with the contact pad 46.

Figure 4:
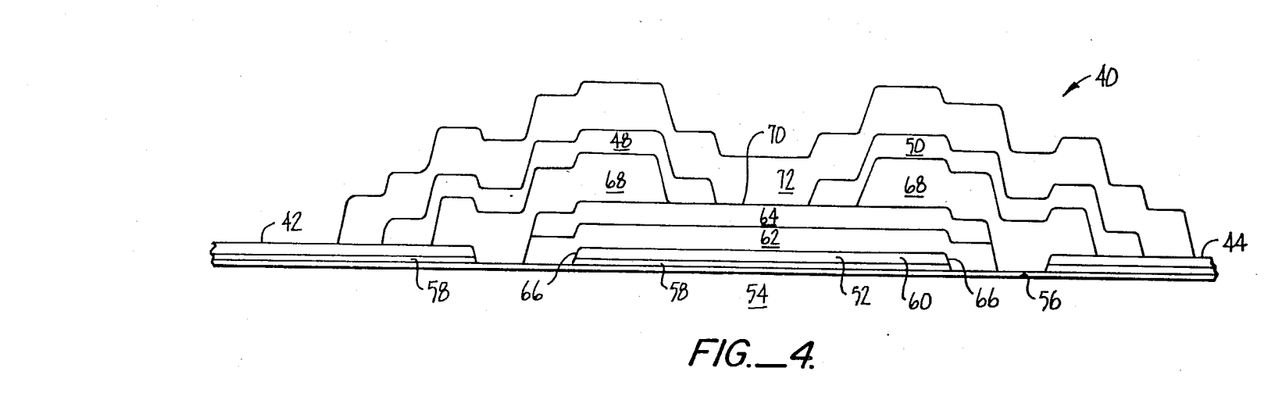
FIG. 4 is a first embodiment of a transistor of the present invention taken along the line 4—4 of FIG. 3.

Referring now more particularly to FIG. 4, there is shown a schematic representation of one preferred embodiment of the transistor 40 made in accordance with the present invention. A substrate 54 will include a barrier $SiO_2$ layer 56 thereon when the transistor 40 is utilized with an ITO layer 58, such as in a flat panel display. The detailed deposition steps will be described with respect to FIGS. 6–10. A gate metal layer 60 is deposited on the ITO layer 58. In other applications the gate metal layer 60 is deposited directly on the substrate 54. The substrate can be glass, ceramic or metal with an insulator layer thereon.

The layers 58 and 60 or 60 are etched to form the gate electrode 52. A gate insulator 62 and a semiconductor material 64 are sequentially deposited over the gate 52. The material 64 preferably is an amorphous silicon alloy. To avoid the possibility of any gate to source or drain shorts at gate edges 66, dielectric layer 68 is deposited over the gate 52, the gate insulator 62 and the semiconductor 64. The dielectric 68 is deposited to a sufficient thickness to ensure that no shorts or thin spots are formed between the edges 66 of the gate 52 and the drain 48 and the source 50.

The dielectric 68 is etched away only on a substantially planar central region 70 of the semiconductor layer 64. This insures uniform operating characteristics for the transistors 40. The drain 48 and source 50 are then deposited to connect the transistor 40 to the drain contact pad 42 and the source contact pad 44 respectively. The drain and source metal can be deposited to also cover the pads 42 and 44 to form continuous electrodes. In appropriate circuits, the pads 42 and 44 can be eliminated and the drain 48 and source 50 can be extended to make the appropriate contacts. A passivating layer 72 is deposited over the whole structure to complete the structure of the transistor 40.

Figure 5:
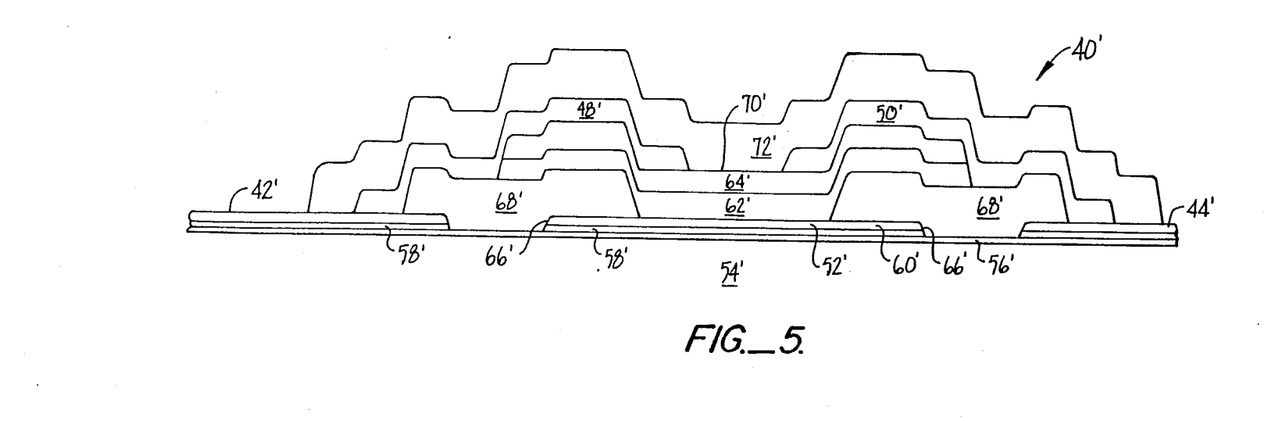
FIG. 5 is a second embodiment of a transistor of the present invention.
Figure 6:
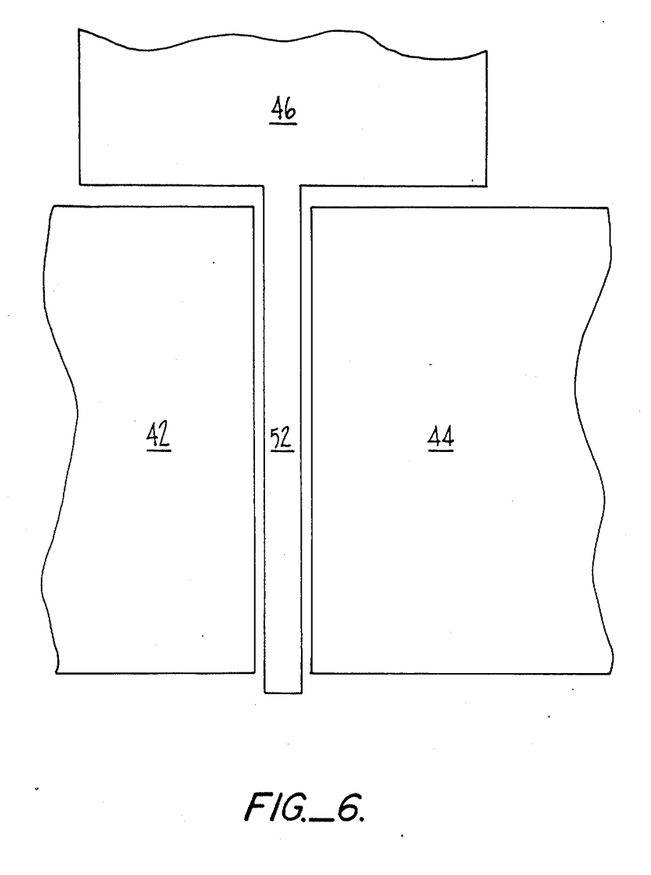
FIGS. 6–10 are partial plan views of the transistor manufacturing steps.

An alternate embodiment of the transistor 40' is illustrated in FIG. 5. The major difference is that the dielectric 68' is deposited before the gate insulator 62', but the dielectric 68' performs the same function as in the FIG. 4 embodiment, as does the gate metal layer 60'.

The detailed deposition procedure will now be described, referring to FIGS. 3, 4 and 6-10. Although generally users can purchase the substrates 54 with the $SiO_2$ barrier layer 56 or the layer 56 and ITO layer 58 thereon, it is preferred that the substrate 54 be purchased without any of the layers deposited thereon. This avoids any nonuniformity or other defects and also allows the layers 56 and 60; or 56, 58 and 60 to be deposited in one deposition run utilizing semiconductor standards.

When utilizing an ITO layer, defects in the ITO layer 58 under the gate 52 can cause shorts. The substrate 54 is first cleaned, such as by a dionized water rinse and dried. The surface of the substrate 54 is then sputter etched which is followed by depositing the $SiO_2$ layer 56, to a thickness in the range of about 250-2000 Å, and preferably about 500 Å, the ITO layer 58 to a thickness in the range of about 100-500 Å and preferably about 300 Å and then the gate metal layer 60 to a thickness in the range of 500-2000 Å and preferably about 1000 Å.

The gate metal 60 preferably is a refractory metal and is preferably $Ni_xCr_{1-x}$, $0 \leq X \leq 0.8$, and most preferably $Ni_{60}Cr_{40}$. Other refractory metals and alloys such as Ti, TiW, Mo or Ta can also be utilized to meet the following functions. The refractory metal 60 shields the ITO layer 58 from the processing gases and etchants to insure that the thickness, integrity, resistivity and optical characteristics of the ITO layer 58 are retained. Therefore the refractory metal must withstand the gas plasmas containing silane ($SiH_4$), which can be at processing temperatures of greater than 200° C. which an unprotected ITO layer 58 will react with. For example, $SiH_4$ is generally utilized as one of the gases to produce silicon nitride ($Si_3N_4$) and hence would attack the ITO layer 32 in forming the prior art transistor 22 (FIG. 2). The other steps as described below include metal deposition, plasma etching, chemical etching and photoresist stripping.

The gate refractory metal 60 must have good adhesion to the ITO layer 58 as well as the gate insulator 62, the dielectric 68 and the drain 48. When light is passed through the substrate 54, then the gate 52 provides a required gate light blocking function since the transistor 40 is light sensitive. If light is directed through the other side of the backplane then the passivating layer 72 will include a light blocking material or another light blocking layer will be added. The refractory metal 60 must be etchable from the ITO layer 58 without effecting it when the structure of the transistor 40 is complete.

Further, in any device, the gate metal must serve as a stable gate 52 and should have a low sheet resistivity. For example, $Ni_{60}Cr_{40}$ about 1000 Å thick has a sheet resistivity of about 10 ohms/square which is necessary for efficient operation, especially when utilizing long gate lines in the backplane or other integrated circuit device. The refractory or other gate metal must adhere to the surface of the substrate 54 or to the surface of the insulator 56 which could be $SiO_2$ for glass or could be $SiO_2$, $Ta_2O_5$ or $Si_3N_4$ or other insulating material for metal substrates.

A photoresist is applied to the gate metal layer 60 which is then soft baked. The photoresist is aligned and exposed through a mask and then is developed and hard baked. The metal layer 60 (and the ITO layer 58) are then successively etched, rinsed and dried. Then the photoresist is stripped from the substrate, which is then rinsed and dried leaving the pattern shown in FIG. 6. This leaves a pattern of gate 52 and gate pad 46, and contact pads 42 and 44.

Figure 7:
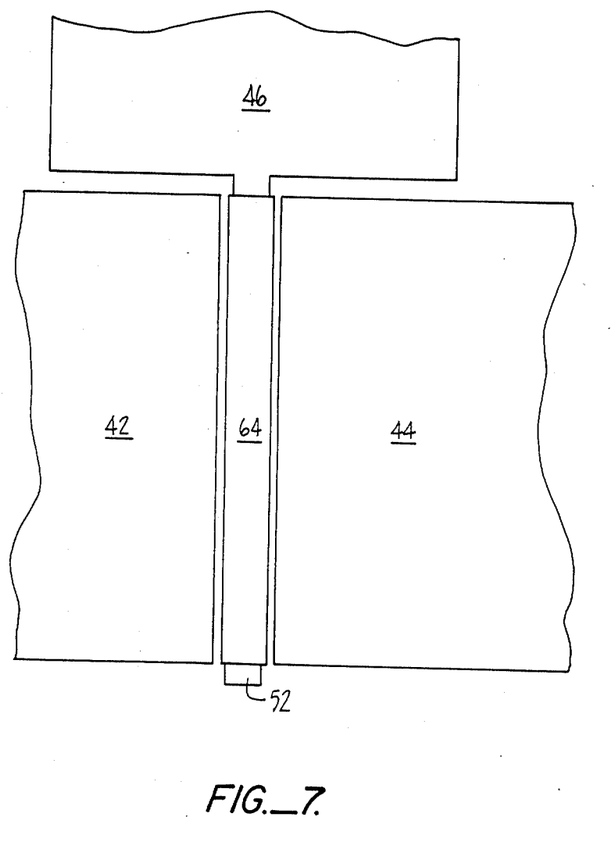

The gate insulator 62 and the semiconductor layer 64 are now sequentially deposited, preferably in a plasma at a substrate temperature of about 275° C. The insulator layer 62 preferably is $Si_3N_4$ deposited in the range of about 500 to 5000 Å thick and preferably about 2500 Å thick. The semiconductor layer 64 preferably is an amorphous silicon alloy and is preferably deposited from $SiH_4$ to a thickness of about 300 to 5000 Å and preferably about 2500 Å. A photoresist is spun on, soft baked, aligned, exposed, developed and etched. The layers 62 and 64 are preferably plasma etched in a carbon tetrafluoride ($CF_4$) plasma. The photoresist is then stripped, rinsed and dried. This results in the active semiconductor area 64 on top of the length of the gate 52 as shown in FIG. 7.

Figure 8:
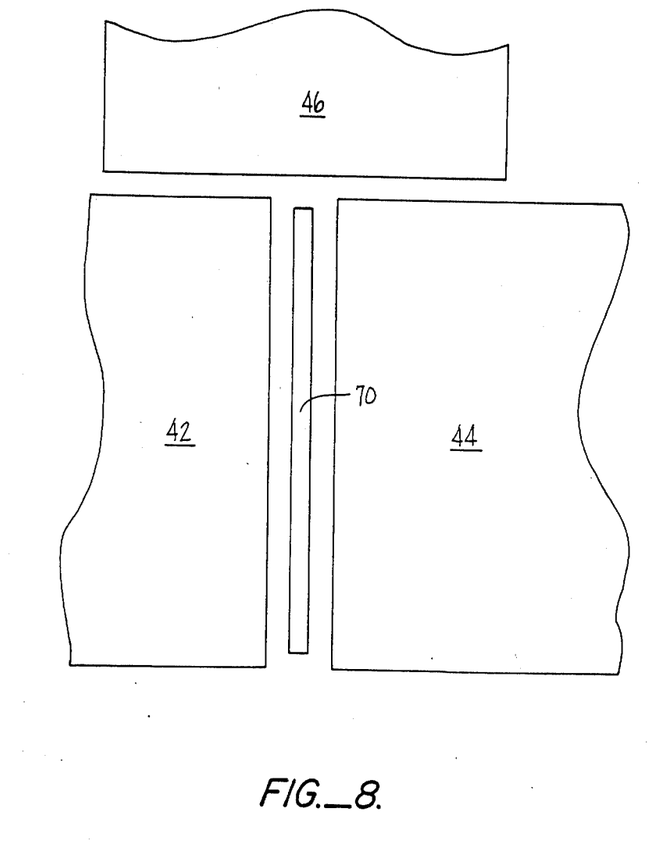

The dielectric 68 is then deposited, preferably in a plasma with a substrate temperature of 250° C. The dielectric preferably is $SiO_2$ with a thickness in the range of 2000-10,000 Å and preferably about 5000 Å. The photoresist is then applied, soft baked, aligned and exposed. The resist is then developed out from the areas over the central portion 70 of the semiconductor layer 64, and the drain, source and gate contact pads 42, 44 and 46. After hard baking the exposed $SiO_2$ layer is etched, and then the resist is stripped, rinsed and dried to leave the central portions 70 and the drain, source and gate contact pads 42, 44 and 46 exposed as shown in FIG. 8.

Figure 9:
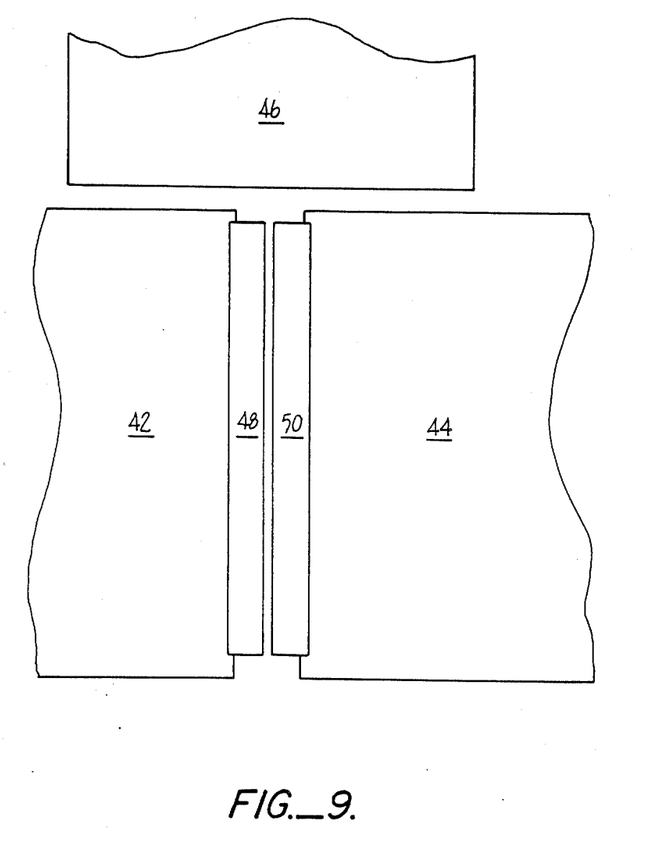
Figure 10:
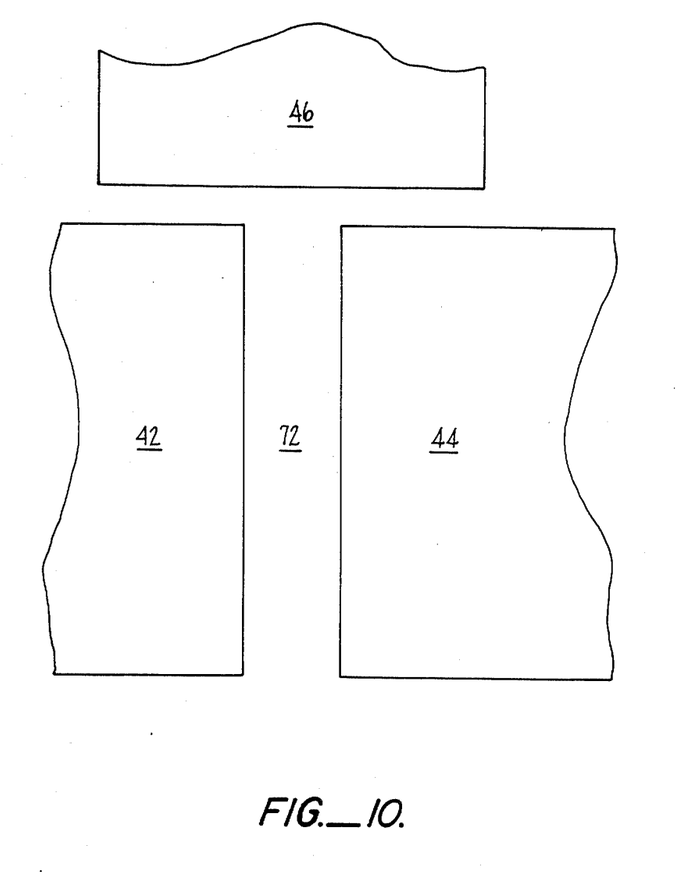

An aluminum alloy is then sputter deposited or evaporated to a thickness in the range of about 500 to 5000 Å and preferably about 2500 Å. A photoresist is then applied, soft baked, aligned, exposed, developed and hard baked. The exposed alloy is then etched. The photoresist is then stripped, rinsed and dried to leave the drain and the source 48 and 50 contacting the drain and source pads 42 and 44 as shown in FIG. 9. Alternatively, the alloy can be left covering the pads 42, 44 and 46 to facilitate wire bonding to the pads.

The passivation layer 72 is then deposited, preferably $SiO_2$ or $Si_3N_4$, from a plasma with a substrate temperature of about 250° C. to a thickness in the range of 2000 to 10,000 Å and preferably about 5000 Å. A photoresist is then applied, soft baked, aligned and exposed. The resist is then developed from the drain, source and gate contact pads 42, 44 and 46. After hard baking the passivation layer is then removed from these areas by buffered oxide etch or plasma, rinsed and dried leaving the pattern shown in FIG. 10.

In view of the above discussion, it can readily be seen that the present invention provides a method of making transistors 40 for any type of device that radically decreases production costs by substantially increasing the yield of profitable products.

Modifications and variations of the present invention are possible in light of the above teachings. The transistors 40 and the devices incorporating them can be of any desired shape and size. Also, any type of thin film semiconductor material can be utilized, not just those formed from silane. The amorphous silicon alloys can be deposited from any suitable reaction gas mixture containing at least silicon and hydrogen. Further, other semiconductor materials can be utilized such as cadmium selenide, (CdSe), which can be deposited by sputtering or evaporation processes. It is therefore to be understood that within the scope of the appended claims the invention may be practiced otherwise than as specifically described.

What is claimed and desired to be secured by Letters Patent of the United States is:

1. An improved thin film transistor, comprising:
   a substrate;
   a gate electrode formed on said substrate and having at least one exposed edge;
   a gate insulator formed on said gate electrode, said gate insulator formed to substantially cover said gate electrode;
   a semiconductor material formed on said insulator, said semiconductor material formed to substantially cover said gate insulator;
   a dielectric formed adjacent said edge of said gate electrode, said dielectric formed over said gate electrode, said insulator and said semiconductor material having a central portion of said dielectric removed to expose a substantially planar portion of said semiconductor material;
   a drain electrode formed on at least a portion of said dielectric and on said planar portion adjacent said edge of said gate electrode and spaced therefrom; and
   a source electrode formed on another portion of said dielectric and on said planar portion and spaced from said drain electrode.

2. The transistor as claimed in claim 1 wherein:
   said substrate is a glass substrate;
   an insulator layer is formed on said substrate; and
   a conductive oxide layer is formed on said insulator layer.

3. The transistor as claimed in claim 2 wherein:
   said gate electrode includes a refractory metal layer formed on said conductive oxide layer; and
   said refractory metal and said conductive oxide layer form said gate electrode.

4. The transistor as claimed in claim 3 further including:
   said refractory metal and said conductive oxide layer are patterned to form at least one gate electrode, gate contact pad, drain contact pad and source contact pad with said gate electrode coupled to said gate contact pad.

5. The transistor as claimed in claim 1 including:
   a drain contact pad, a source contact pad and a gate contact pad on said substrate spaced from one another, said gate electrode and said gate contact pad formed integral with one another;
   said drain electrode coupling said semiconductor material to said drain pad; and
   said source electrode coupling said semiconductor material to said source pad.

6. The transistor as claimed in claim 5 including:
   said drain electrode covering said drain pad; and
   said source electrode covering said source pad.

7. The transistor as claimed in claim 1 wherein:
   said semiconductor material is an amorphous silicon alloy.

8. An improved thin film transistor, comprising:
   a substrate;
   a gate electrode formed on said substrate and having at least one exposed edge;
   a gate insulator formed on said gate electrode;
   a semiconductor material formed on said insulator;
   a dielectric formed adjacent to or on said edge of said gate electrode, said dielectric formed to cover said gate electrode with a central portion of said dielectric removed to expose a substantially planar portion of said gate electrode with said insulator and said semiconductor material formed on said gate electrode;
   a drain electrode formed on at least a portion of said dielectric and on said semiconductor material adjacent said edge of said gate electrode; and
   a source electrode formed on another portion of said dielectric and on said semiconductor material and spaced from said drain electrode.

9. The transistor as claimed in claim 8 wherein:
   said semiconductor material is an amorphous silicon alloy.

10. The transistor as claimed in claim 8 wherein:
    said substrate is a glass substrate;
    an insulator layer is formed on said substrate; and
    a conductive oxide layer is formed on said insulator layer.

11. The transistor as claimed in claim 10 wherein:
    said gate electrode includes a refractory metal layer formed on said conductive oxide layer; and
    said refractory metal and said conductive oxide layer form said gate electrode.

12. The transistor as claimed in claim 11 wherein:
    said semiconductor material is an amorphous silicon alloy.

13. The transistor as claimed in claim 8 including:
    a drain contact pad, a source contact pad and a gate contact pad on said substrate spaced from one another, said gate electrode and said gate contact pad formed integral with one another;
    said drain electrode coupling said semiconductor material to said drain pad; and
    said source electrode coupling said semiconductor material to said source pad.

14. The transistor as claimed in claim 13 including:
    said drain electrode covering said drain pad; and
    said source electrode covering said source pad.

* * * * *